United States Patent
Taguchi et al.

(10) Patent No.: US 6,914,737 B2
(45) Date of Patent: Jul. 5, 2005

(54) APPARATUS FOR RECORDING AND REGENERATING DATA

(75) Inventors: Masakazu Taguchi, Kawasaki (JP); Akihiro Itakura, Kawasaki (JP); Akiyoshi Uchida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 15 days.

(21) Appl. No.: 10/681,642

(22) Filed: Oct. 8, 2003

(65) Prior Publication Data

US 2004/0071069 A1 Apr. 15, 2004

Related U.S. Application Data

(62) Division of application No. 09/790,087, filed on Feb. 21, 2001, now Pat. No. 6,667,841.

(30) Foreign Application Priority Data

Jun. 27, 2000 (JP) .................................. 2000-193370

(51) Int. Cl.[7] .................................................. G11B 5/09
(52) U.S. Cl. ........................ 360/46; 360/65; 714/795; 375/341
(58) Field of Search ................... 360/46, 65; 375/341, 375/262; 714/794–795

(56) References Cited

U.S. PATENT DOCUMENTS 5,291,524 A * 3/1994 Itakura et al. .............. 375/341
5,432,820 A * 7/1995 Sugawara et al. .......... 375/341

* cited by examiner

*Primary Examiner*—David Hudspeth
*Assistant Examiner*—Dan I Davidson
(74) *Attorney, Agent, or Firm*—Greer, Burns & Crain, Ltd.

(57) ABSTRACT

In an apparatus for recording and regenerating data, a pass metric is calculated based on a likelihood converted from a previous calculation result iteratively until all pass metrics of the same data recorded many times on a recording medium are calculated, and then data recorded on the recording medium is decoded.

7 Claims, 21 Drawing Sheets

FIG.6
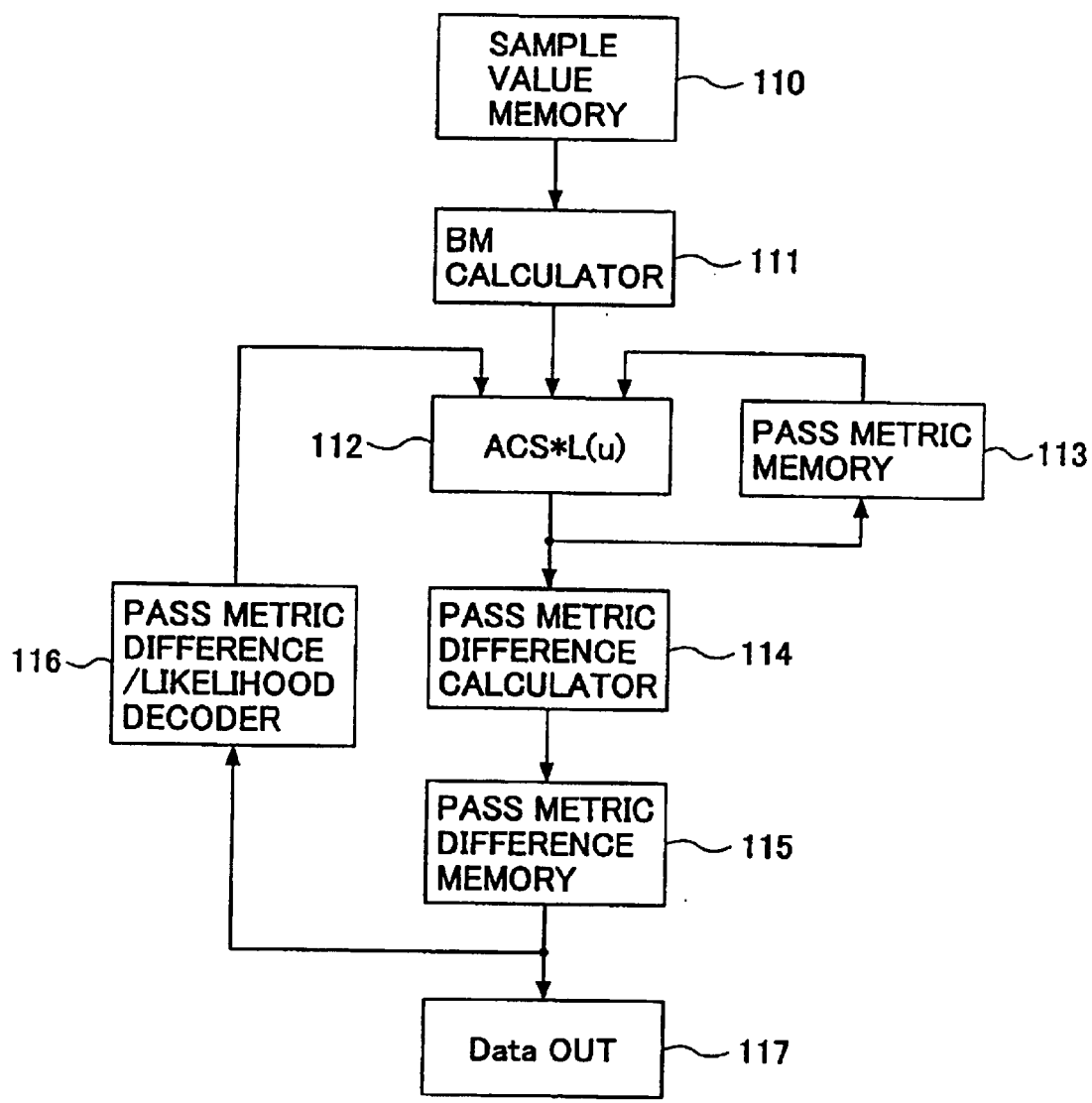
FIG.7
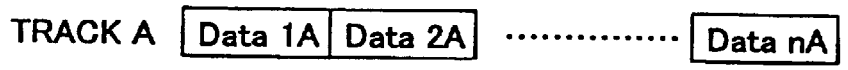
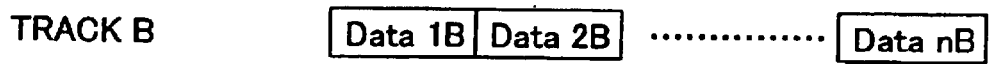

| TIME | t−1 | t | EXPECTED VALUE Ph |
|---|---|---|---|
| | 0 | 0 | P0=0 |
| DATA SEQUENCE | 0 | 1 | P1=1 |
| | 1 | 0 | P2=1 |
| | 1 | 1 | P3=2 |

FIG.14
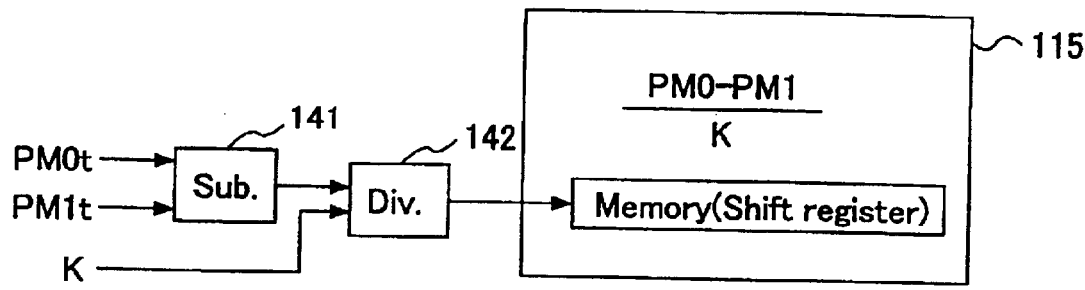
FIG.15
$$L1'(u) = \frac{K-(PM0-PM1)}{K} = 1 - \underbrace{\frac{PM0-PM1}{K}}_{\text{COMMON FRACTION}}$$
$$L0'(u) = \frac{K+(PM0-PM1)}{K} = 1 + \underbrace{\frac{PM0-PM1}{K}}_{\text{COMMON FRACTION}}$$
FIG.16
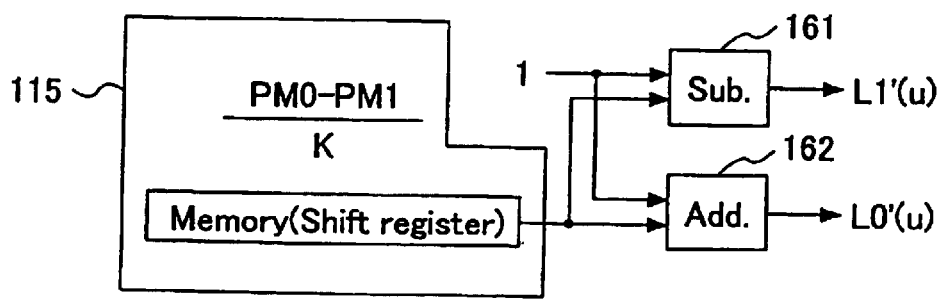

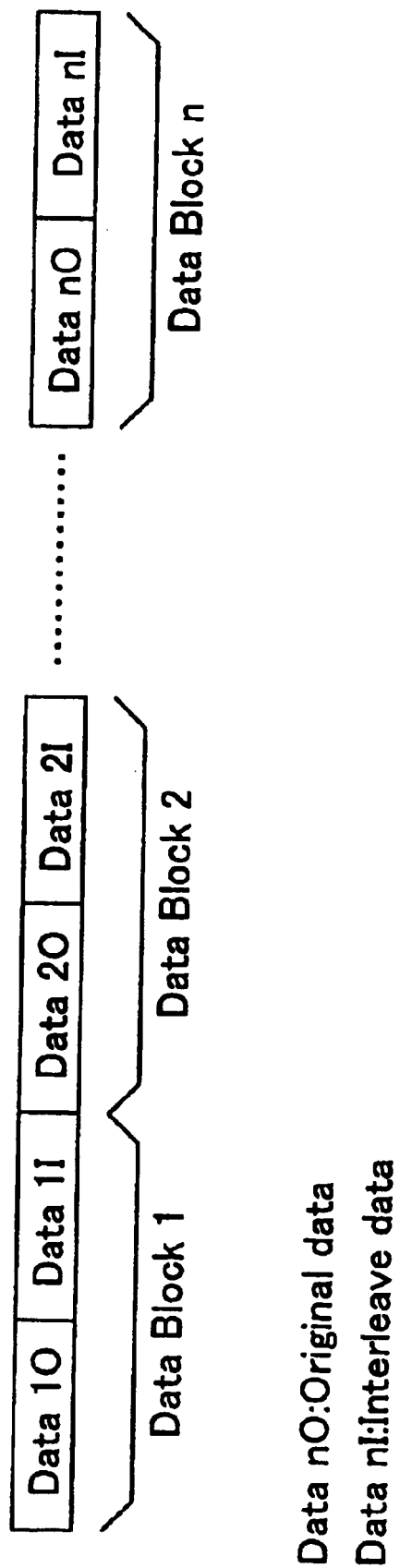

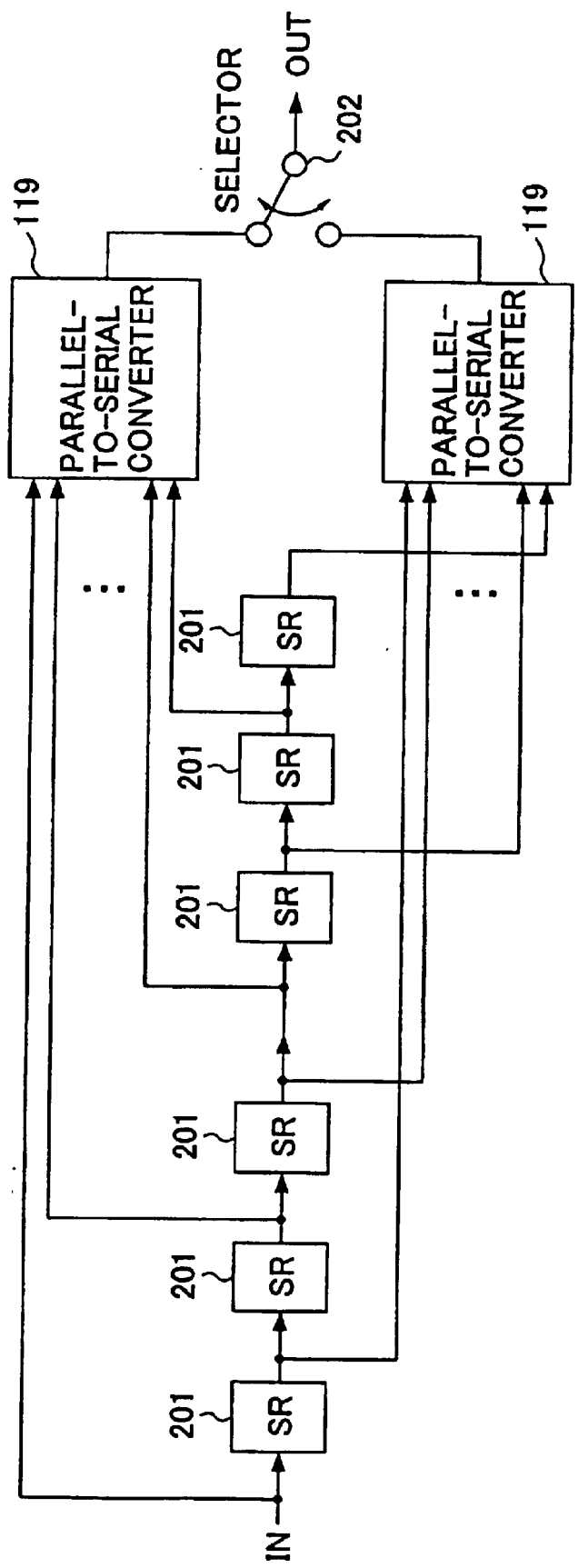

FIG.21

| A | EXOR | B | → | C |
|---|---|---|---|---|
| 0 | | 0 | | 0 |
| 0 | | 1 | | 1 |
| 1 | | 0 | | 1 |
| 1 | | 1 | | 0 |

PROBABILITY PA (0) THAT A IS "0"
PROBABILITY PA (1) THAT A IS "1"

PROBABILITY PB (0) THAT B IS "0"
PROBABILITY PB (1) THAT B IS "1"

PROBABILITY PC (0) THAT C IS "0"
PROBABILITY PC (1) THAT C IS "1"

PA(0)+PA(1)=1
PB(0)+PB(1)=1
PC(0)+PC(1)=1

$PC(0) = PA(0)*PB(0) + PA(1)*PB(1)$ ---(1)
$PC(1) = PA(0)*PB(1) + PA(1)*PB(0)$ ---(2)

FROM EXPRESSION (1)
$PC(0) = (1-PA(1))*(1-PB(1)) + PA(1)*PB(1)$
$= 1 - (PA(1)+PB(1)) - 2*PA(1)*PB(1))$

FROM EXPRESSION (2)
$PC(1) = (1-PA(1))*PB(1) + PA(1)*(1-PB(1))$
$= PA(1)+PB(1) - 2*PA(1)*PB(1)$

APPARATUS FOR RECORDING AND REGENERATING DATA

This application is a division of application Ser. No. 09/790,087, filed Feb. 21, 2001, now U.S. Pat. No. 6,667,841.

BACKGROUND OF THE INVENTION

1. Field of the Invention

The present invention generally relates to apparatuses for recording and regenerating data, and more particularly to an apparatus for recording and regenerating data, which apparatus can reduce data regeneration errors caused by a defect of a recording medium or waveform interference between data indicated by a regenerative signal and improve a data generation rate.

Also, the present invention relates to the apparatus for recording and regenerating data which apparatus can eliminate low-frequency noise and high-frequency noise included in a regenerative signal of recorded data and then regenerate the recorded data.

2. Description of the Related Art

Recently, there are many kinds of apparatuses for recording data such as a magnetic disk, a magnetic tape, an optical disk, a magneto-optical disk or the like. A magnetic recording mark is mainly used to record data to these apparatuses. These apparatuses can permanently maintains data more than a semiconductor memory. Thus, since a large amount of data is currently required to process, these apparatus for computers are essential to record graphics and image data for computers.

In a conventional data recording apparatus, data are recorded in accordance with a predetermined format. FIG. 1 is a diagram showing a conventional data format. In the conventional data format, data or data blocks are recorded simultaneously while a VFO area for an AGC (Automatic Gain Control) adjustment and a PLL (Phase-Locked Loop), a Sync-pattern indicating a start of data, or a Resync-pattern for re-synchronizing is inserted. In FIG. 1, these patterns are omitted. In the conventional data recording apparatus, data or data blocks are recorded once on a track or a sector.

FIG. 2 is a diagram showing a conventional circuit configuration for regenerating data recorded in accordance with the data format shown in FIG. 1. In FIG. 2, the conventional circuit configuration is for a most likelihood decode. In the conventional circuit configuration, a BM (Branch Metric) for a sample value 10 obtained by sampling a regenerative signal is calculated at a BM (Branch Metric) calculator 11 and pass metric values are compared at an ACS (Add-Compare-Select) 13. Then, selected pass data is sent to a pass memory 14 and also accumulated in a pass metric memory 12 for a next pass metric calculation. In the pass memory 14, a pass merge occurs and then a most likelihood data is output to a DataOUT 15 as a decoded data. It is called a most likelihood detection known as a decoding method that is strong against noise.

However, since a data recording technology has been developed quickly to record data at higher density, a signal to noise ratio (SNR) is deteriorated by data recorded at higher density. Thus, the data recorded at higher density can not be properly decoded by the conventional most likelihood detection.

Thus, it is desired to improve a regeneration performance for the data recorded at higher density.

SUMMARY OF THE INVENTION

It is a general object of the present invention to provide apparatuses for recording and regenerating data in which the above-mentioned problems are eliminated.

A more specific object of the present invention is to provide an apparatus for recording and regenerating data, which apparatus can reduce data regeneration errors caused by a defect of a recording medium or waveform interference between data indicated by a regenerative signal and improve a data generation rate.

The above objects of the present invention are achieved by a n apparatus for recording and regenerating data, the apparatus including: a recording part iteratively recording the data on a recording medium predetermined times; a sample value storing part storing a sample value obtained by sampling a regenerative signal from the data iteratively recorded on the recording medium; a pass metric calculating part calculating a branch metric and a pass metric based on the sample value stored in the sample value storing part; and a likelihood converting part converting a calculation result obtained by the pass metric calculating part into likelihood of the calculation result, wherein the pass metric calculating part calculates the pass metric based on the likelihood converted by the likelihood converting part and decodes the data recorded on the recording medium.

According to the present invention, it is possible to provide an apparatus in which data is iteratively recorded predetermined times on the recording medium and the likelihood is update every time the same data iteratively recorded on the recording medium is iteratively decoded. Therefore, it is possible to successfully correct a distortion of a regenerative signal caused by a defect of the recording medium.

The above objects of the present invention are achieved by an apparatus for recording and regenerating data, the apparatus including: recording part iteratively recording the data at a data unit dividing the data by a predetermined data length by sequentially changing a predetermined numbers of recording areas on a recording medium; plurality of storage sample value storing parts corresponding to the predetermined numbers of recording areas, respectively, each storage sample value storing part storing a sample value obtained by sampling a regenerative signal from the data recorded on each recording area at the data unit; plurality of pass metric calculating parts corresponding to the plurality of storage sample value storing parts, respectively, each pass metric calculating part calculating a branch metric and a pass metric based on each sample value; plurality of likelihood converting parts corresponding to the plurality of pass metric calculating parts, respectively, each likelihood converting part converting a calculation result obtained by the each pass metric calculating part into likelihood of the calculation result, wherein the each pass metric calculating part calculates the pass metric based on the likelihood converted by the each likelihood converting part and decodes the data recorded on the recording medium.

According to the present invention, it is possible to provide an apparatus in which data is iteratively recorded on the predetermined numbers of recording areas and the data iteratively recorded on the predetermined numbers of recording areas are decoded by the plurality of decoding systems. Therefore, it is possible to decode the same data recorded on the predetermined numbers of recording areas in serial. In addition, the likelihood for the sample value from a previous recording area can effect a next result of the pass metric calculation in accordance with a sampling order of sampling the data recorded on the predetermined numbers of recording area. Therefore, it is possible to reduce the date decoding error caused by the defect of the recording medium.

The above objects of the present invention are achieved by an apparatus for recording and regenerating data, the apparatus including: a recording part recording original data and interleaved data in that a data order of the original data is changed, on the recording medium; a sample storing part storing sample values obtained by sampling regenerative signals from the original data and from the interleaved data recorded in the recording part; a pass metric calculating part calculating a branch metric and a pass metric based on each of the sample values stored in the sample value storing part; and a likelihood converting part converting each calculation result obtained by the pass metric calculating part into likelihood of the each calculation result; and an order changing-back part changing back an data order of the likelihood based on the change of the data order by the recording part, wherein the pass metric calculating part calculates the pass metric based on the likelihood which data order is changed back by the order changing-back part and decodes the data recorded on the recording medium.

According to the present invention, it is possible to provide an apparatus in which the interleaved data, in which the data order of the original data is changed, is recorded on the recording medium and the data order of the likelihood of the original data is changed in accordance with the data order of the interleaved data in order to use for the pass metric calculation for a next interleafed data. Therefore, in a case in which a certain data order causes the interference of the generative signal, it is possible to eliminate noise caused by the interference and then it is possible to obtain more accurate pass metric value.

The above objects of the present invention are achieved by an apparatus for recording and regenerating data, the apparatus including: a recording part converting a first data to be regenerated into a second data in accordance with a predetermined operation and recording the second data; a first decoding part calculating a branch metric and a pass metric as a first calculation result for a sample data by sampling a regenerative signal from the second data recorded on the recording medium and decoding the second data based on the first calculation result; a first likelihood converting part converting the first calculation result into a first likelihood of the first calculation result, the first likelihood corresponding to the first data; a second decoding part generating a synthesized sample value for the first data by a synthesizing process based on the first likelihood, calculating the branch metric and the pass metric as a second calculation result based on the first likelihood, and decoding the second data based on the second calculation result; and a second likelihood converting part converting the second calculation result into a second likelihood of the second calculation result, the second likelihood corresponding to the second data, wherein the first decoding part calculates the pass metric based on the second likelihood converted by the second likelihood converting part, and one of the first data decoded by the second decoding part and the second data decoded by the first decoding part is output as a regenerated data.

According to the present invention, it is possible to provide an apparatus in which the second data, in which the first data as the original data is converted by the predetermined operation, is recorded on the recording medium and the decoding processes for the first data and the second data are conducted after the first data is generated based on the second data recorded on the recording medium. Therefore, it is not required to record the same data many times on a plurality of recording area on the recording medium. Also, it is possible to obtain the likelihood of the first data from the likelihood of the second data that is different from the first data and then decode the first data. Consequently, it is possible to eliminate the data regeneration error derived from the data order of the first data.

The above objects of the present invention are achieved by an apparatus for recording and regenerating data, the apparatus including: a plurality of equalizing parts equalizing a regenerative signal from data recorded on a recording medium by different types of partial responses; a plurality of decoding parts corresponding to the plurality of equalizers, respectively, each decoding part generating likelihood of a sample value of a regenerative signal equalized by each of the plurality of equalizing part, and decoding the sample value; and a decoded data deciding part deciding decoded data based on any one of decoding results by the plurality of decoding parts, wherein each of the plurality of decoding parts decodes the sample value by considering the likelihood generated by one of other decoding parts.

According to the present invention, it is possible to provide an apparatus that can equalize the regenerative signal from the data recorded on the recording medium by the plurality of partial response equalizers reducing different types of noises. Therefore, it is possible to accurately decode the regenerative signal of the data that recorded on the recording medium at high density.

BRIEF DESCRIPTION OF THE DRAWINGS

Other objects, features and advantages of the present invention will become more apparent from the following detailed description when read in conjunction with the accompanying drawings, in which:

FIG. 6 is a diagram showing a first circuit configuration for suppressing the CNR difference, according to the first embodiment of the present invention;

FIG. 7 is a diagram showing a third data format according to a second embodiment of the present invention;

FIG. 14 is a diagram showing a circuit configuration of the pass metric difference calculator;

FIG. 15 is a diagram showing a relationship between likelihood and a standardized pass metric difference;

FIG. 16 is a diagram showing a circuit configuration of the pass metric difference/likelihood decoder, according to the present invention;

FIG. 17 is a diagram showing the fifth data format according to a fourth embodiment of the present invention;

FIG. 19 is a diagram showing a circuit configuration of the interleaver according to the fourth embodiment of the present invention;

FIG. 21 is a diagram showing the probability calculation according to the fifth embodiment of the present invention;

DESCRIPTION OF THE PREFERRED EMBODIMENTS

Embodiments according to the present invention will be described with reference to figures.

[First Embodiment]

Figure 1:
FIG. 1 is a diagram showing a conventional data format.
Figure 2:
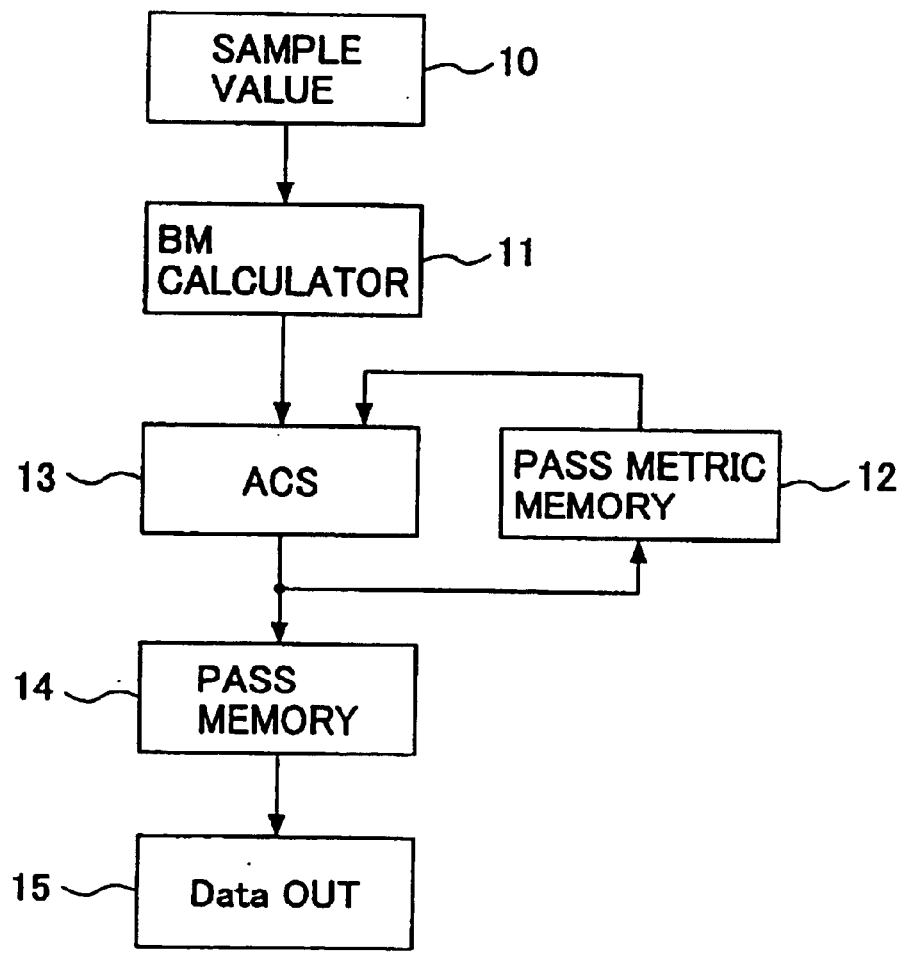
FIG. 2 is a diagram showing a conventional circuit configuration for regenerating data recorded in accordance with the data format shown in FIG. 1.
Figure 3:
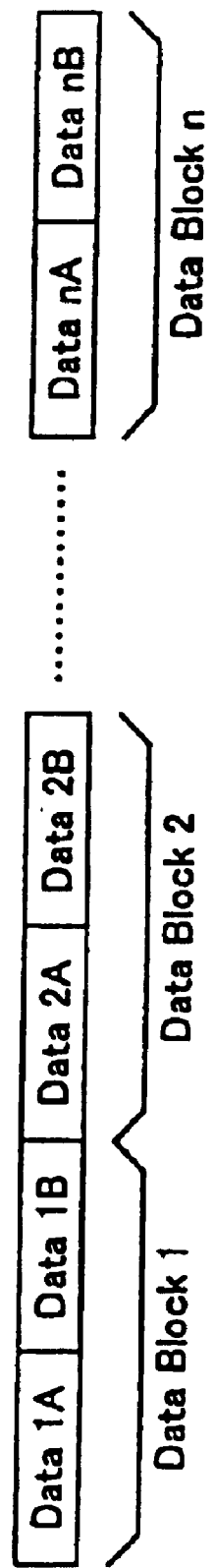
FIG. 3 is a diagram showing a first data format according to a first embodiment of the present invention.

FIG. 3 is a diagram showing a first data format according to a first embodiment of the present invention. For example, in a data regenerating apparatus according to the first embodiment of the present invention, data are written on a recording medium in accordance with the first data format as shown in FIG. 3.

In the first data format in FIG. 3, data to be recorded are divided at a predetermined length. The data divided at the predetermined length are recorded to a recording medium while the same divided data are recorded twice in one data block. In FIG. 3, Data nA and Data nB are the same divided data.

Figure 4:
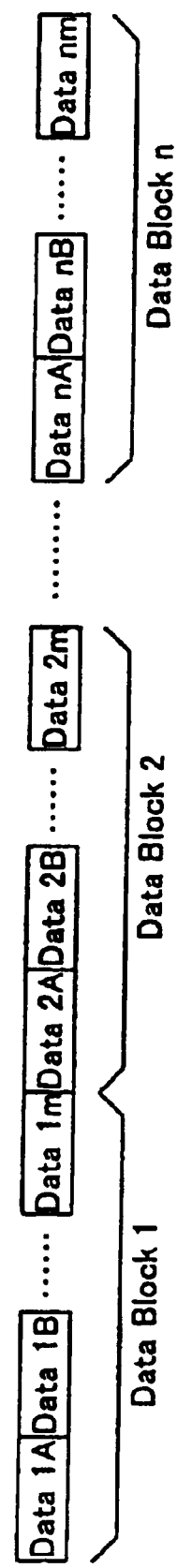
FIG. 4 is a diagram showing a second data format according to the first embodiment of the present invention.

Alternatively, as shown in FIG. 4, the data divided at the predetermined length may be recorded many times for each data block. FIG. 4 is a diagram showing a second data format according to the first embodiment of the present invention. In the second data format shown in FIG. 4, Data nA through Data nm are the same divided data.

Figure 5:
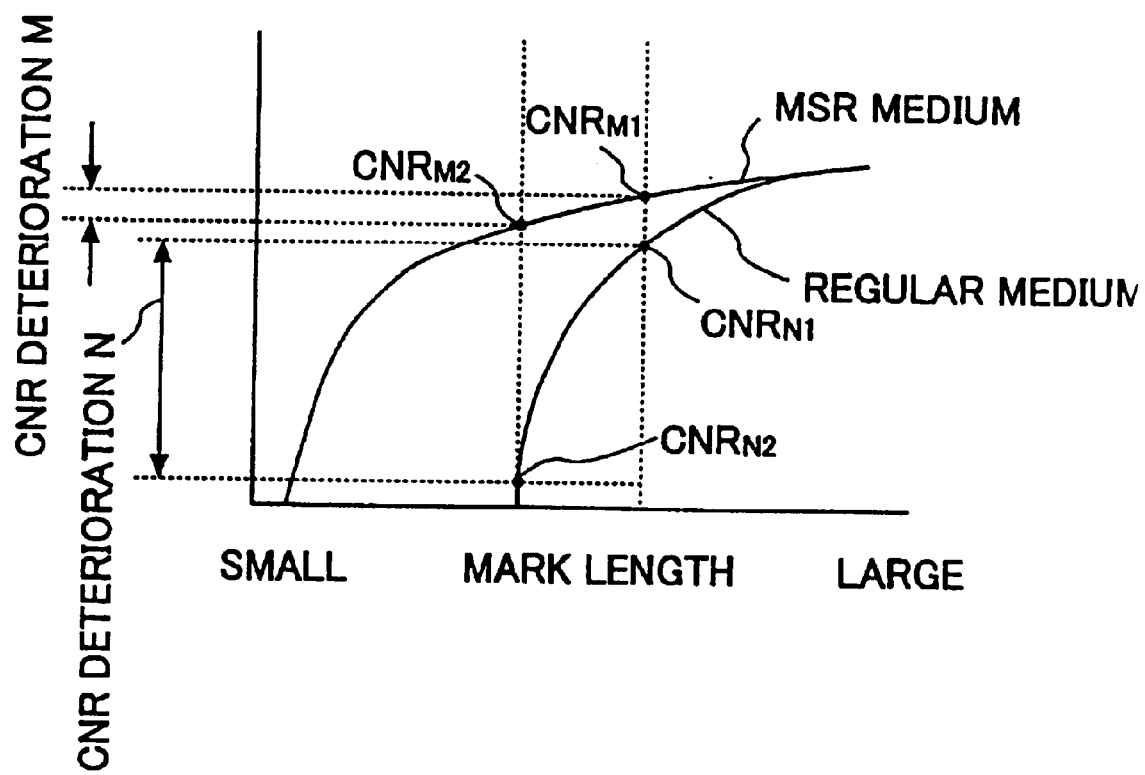
FIG. 5 is a graph showing a relationship between mark length and Carrier to Noise Ratio.

As described above, when data to be recorded is recorded, amount of data recorded to a recording medium becomes twice as large or m times. Regarding to a relationship between a mark length and a CNR (Carrier to Noise Ratio) in FIG. 5, in a case in which data are recorded at a smaller mark length on a MSR (Magnetic Super Resolution) medium, a CNR deterioration M shows a difference between a $CNR_{M1}$ before the data are recorded at a smaller mark length on the MSR medium and a $CNR_{M2}$ after the data are recorded at a smaller mark length on the MSR medium. And in a case in which the data are recorded at a smaller mark length on a regular medium, a CNR deterioration N shows a difference between a $CNR_{N1}$ before the data are recorded at a smaller mark length on the regular medium and a $CNR_{N2}$ after the data are recorded at a smaller mark length on the regular medium. As shown in FIG. 5, the CNR deterioration M is considerably smaller than the CNR deterioration N. In addition, it is possible to suppress the CNR deterioration M, which is caused when the data are recorded at a smaller mark length on the MSR medium, by using the data regenerating apparatus according to the first embodiment of the present invention.

FIG. 6 is a diagram showing a first circuit configuration for suppressing the CNR difference, according to the first embodiment of the present invention.

In FIG. 6, the data regenerating apparatus according to the first embodiment of the present invention includes a sample memory value 110 storing a sample value, a BM calculator 111 for calculating a BM (Branch Metric), an ACS*L(u) 112 for executing an ACS operation using a likelihood L(u), a pass metric memory 113 for storing a pass metric value, a pass metric difference calculator 114 for calculating a difference between pass metric values, a pass metric difference memory 115 for storing the calculated difference between pass metric values, a pass metric difference/likelihood detector 116 for converting the pass metric value into a likelihood, and a DataOUT 117 for outputting regenerated data.

In FIG. 6, a regenerative signal of data read from a recording medium is sampled and then the sample value is stored in the sample value memory 110. For example, in a case in which a single sequential data is divided at a predetermined data length and then the divided data is recorded, data having the predetermined data length is stored in the sample value memory 110. That is, when the first data format shown in FIG. 3 is used, sample value of Data 1A is stored first. After that, sample value of each of Data 1B, Data 2A, Data 2B, . . . , Data nB are stored in order. Similarly, sample value of data stored in accordance with the second data format shown in FIG. 4 are stored in the sample value memory 110.

Subsequently, the BM calculation is conducted for the sample value stored in the sample value memory 110 at the BM calculator 111 and then the ACS operation considering likelihood L(u) is conducted based on the BM values of the sample value, initial likelihood values and initial pass metric values at the ACS*L(u) 114.

At the pass metric difference calculator 114, a difference between pass metric values of data "0" and data "1" obtained at the ACS*L(u) is calculated and then is stored in the pass metric difference memory 115. The difference between the pass metric values corresponds to likelihood. Thereafter, the difference is converted into the likelihood at the pass metric difference/likelihood decoder 116.

By the BM calculator 111, a BM value of next sample value of the predetermined data length, which values are stored in the sample value memory 110, is calculated. At the ACS*L(u) 112, the pass metric value is updated by the BM value of the next sample value, the pass metric value of previous sample value is stored in the pass metric memory 113 and the likelihood of previous sample value is converted at the pass metric difference/likelihood decoder 116. The updated pass metric value is stored in the pass metric memory 113. Also, the same process described above is conducted at the pass metric difference calculator 114 and the pass metric difference memory 115. Then, the DataOUT117 outputs regenerated data having the predetermined data length.

Detail circuit configurations of the BM calculator 111, the ACS*L(u) 112, the pass metric memory 113, the pass metric difference calculator 114 and the pass metric difference/likelihood decoder 116 will be described later.

[Second Embodiment]

FIG. 7 is a diagram showing a third data format according to a second embodiment of the present invention. The third data format shown in FIG. 7 is different from the first data format in FIG. 3 or the second data format in FIG. 4 in the first embodiment in which the single sequential data is recorded many times at the predetermined data length. The third data format in FIG. 7 is used to record the single sequential data many times on different tracks at the predetermined data length.

In FIG. 7, Data 1A, Data 2A, . . . , Data nA, which are divided at the predetermined data length, are recorded on a track A in order. And, Data 1B, Data 2B, . . . , Data nB, which are divided at the predetermined data length, are recorded on a track B in order.

Figure 8:
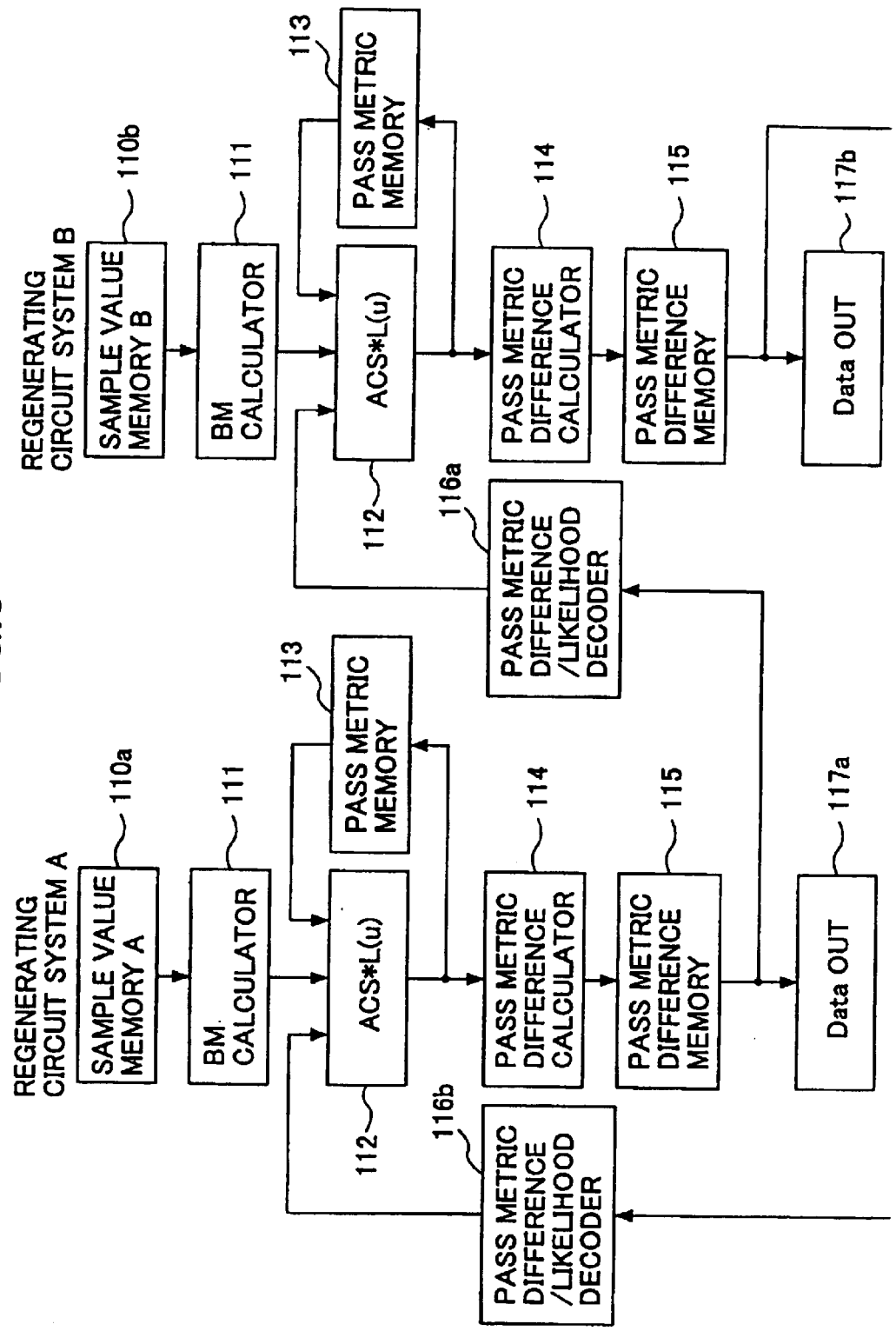
FIG. 8 is a diagram showing a second circuit configuration according to the second embodiment of the present invention.

A circuit configuration corresponding to the data format in FIG. 7 will now be described. FIG. 8 is a diagram showing a second circuit configuration according to the second embodiment of the present invention. In FIG. 8, circuits that are the same as the ones in FIG. 6 are indicated by the same reference numerals and the explanation thereof will be omitted.

In FIG. 8, a data regenerating apparatus according to the second embodiment of the present invention includes a regenerating circuit system A corresponding to the track A in FIG. 7 and a regenerating circuit system B corresponding to the track B in FIG. 7. When data are sampled, likelihood is calculated based on the sample value of the Data 1A and then data are regenerated by the sample value of the Data 1B and the calculated likelihood of the Data 1A. Thus, the Data 2A is sampled after the Data 1A is sampled in the regenerating circuit system A while the Data 1B is sampled in the regenerating circuit system B. In the regenerating circuit system B, data is always sampled at one predetermined data length behind the regenerating circuit system A.

In the regenerating circuit system A, when data recorded on the track A is sampled at the predetermined data length and then the sample value is stored in the sample value memory A 110a. Subsequently, the same processes as those in FIG. 6 is conducted at the BM calculator 111, the ACS*L(u) 112, the pass metric memory 113, the pass metric difference calculator 114 and the pass metric difference memory 115. Then, the pass metric difference obtained from the processed is converted into the likelihood at the pass metric difference/likelihood decoder 116a.

In the regenerating circuit system B, data recorded on the track B is sampled at one predetermined data length behind data being sampled in the regenerating circuit system A and then the sample value is stored in the sample value memory B 110b. Subsequently, the same processes as those in FIG. 6 are conducted at the BM calculator 111, the ACS*L(u) 112, the pass metric memory 113, the pass metric difference calculator 114 and the pass metric difference memory 115. Then, the pass metric difference obtained from the process is converted into the likelihood at the pass metric difference/likelihood decoder 116b. In the ACS*L(u) 112 of the regenerating circuit system B, the likelihood, which is converted by the pass metric difference/likelihood decoder 116a of the regenerating circuit system A, is used.

When the same sample value is iterated to be processed in the regenerating circuit system A, the ACS*L(u) 112 uses the likelihood converted by the pass metric difference/likelihood decoder 116b of the regenerating circuit system B.

Either one of the DataOUT 117a and the DataOUT 117b may be selected in accordance with the iterative process to output data regenerated from the sample value.

Alternatively, in a case in which the iterative process is not conducted, the pass metric difference/likelihood decoder 116b can be omitted. In this case, the regenerated data is output from the DataOUT 117b.

In the third circuit configuration shown in FIG. 8 according to the second embodiment of the present invention, the regenerating circuit systems A and B regenerate data by one predetermined data length. That is, the Data nA and the Data (n−1)B can be simultaneously processed. Therefore, it is possible to transmit data at higher speed than the first circuit configuration in FIG. 6 corresponding to the second data format in FIG. 4.

[Third Embodiment]

Figure 9:
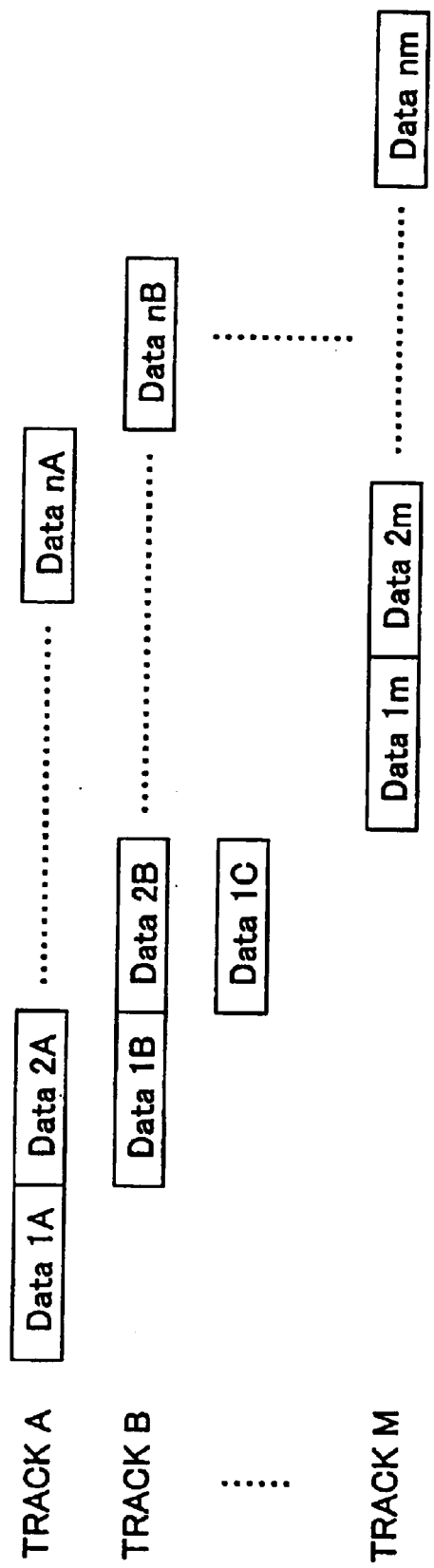
FIG. 9 is a diagram showing a fourth data format according to a third embodiment of the present invention.

FIG. 9 is a diagram showing a fourth data format according to a third embodiment of the present invention. In FIG. 9, the same data is recorded on a plurality of tracks A, B, . . . , M.

In the fourth data format shown in FIG. 9, similarly to the third data format in FIG. 7 in the second embodiment, Data 1A, Data 2A, . . . , Data nA, which a single sequential data is divided into at a predetermined data length, are recorded on the track A in order. Data 1B, Data 2B, . . . , Data nB, which the single sequential data is divided into at the predetermined data length, is recorded on the track B in order. And, Data 1M, Data 2M, . . . , Data nM, in which the single sequential data is divided into the predetermined data length, is recorded on the track M in order.

Figure 10:
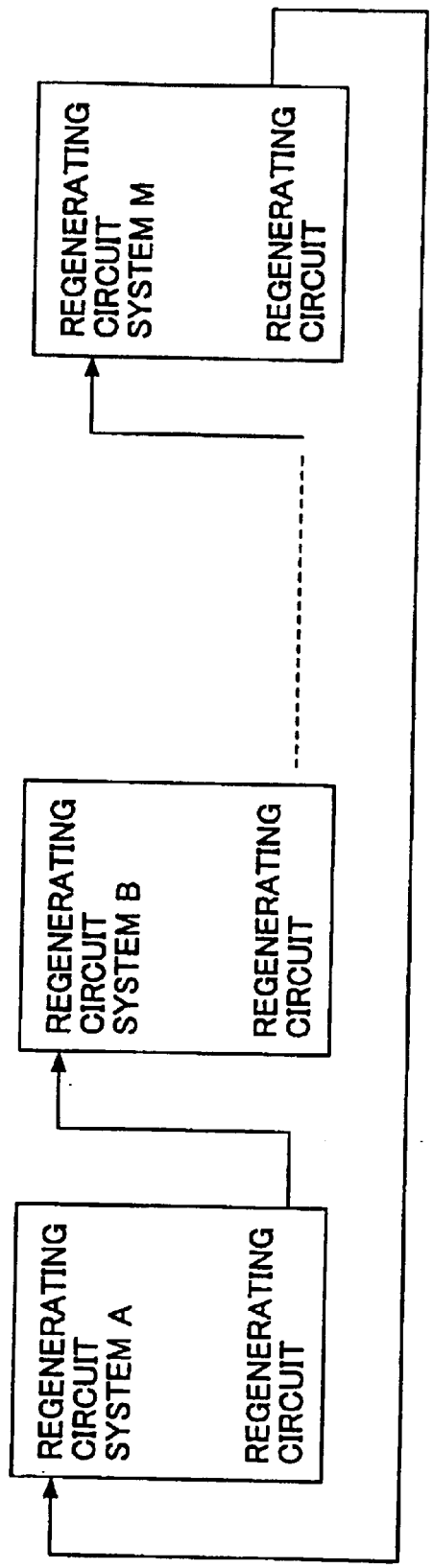
FIG. 10 is a diagram showing a third circuit configuration corresponding to the fourth data format shown in FIG. 9, according to the third embodiment of the present invention.

FIG. 10 is a diagram showing a third circuit configuration corresponding to the fourth data format shown in FIG. 9, according to the third embodiment of the present invention.

In FIG. 10, a data regenerating apparatus according to the third embodiment of the present invention includes a regenerating circuit system A, a regenerating circuit system B, . . . , and a regenerating circuit system M for the track A, the track B, . . . , the track M, respectively. Each of the regenerating circuit system A, the regenerating circuit system B, . . . and the regenerating circuit system M includes the same circuit as that in FIG. 6 and is coupled in serial.

Similarly to the second circuit configuration shown in FIG. 8, each of regenerating circuit systems A, B, . . . and M samples data from the corresponding track A, B, . . . or M at one predetermined data length behind a preceding regenerating circuit system.

In the third embodiment, when the same data is recorded on the plurality of tracks, the data is simultaneously recorded to the plurality of tracks in parallel but the data is sequentially displaced for one predetermined data length on each track. Alternatively, the same data recorded on the plurality of tracks are simultaneously regenerated while the data on each track is read and sampled by shifting timing for reading data of the predetermined data length and then the sample value of the data is stored in the sample value memory 110 in each of the regenerating circuit systems A, B, . . . and M in sequence.

In a case in which the iterative process from the regenerating circuit system M to the regenerating circuit system A is not conducted, the DataOUT 117 of the regenerating circuit system M may output regenerated data.

Figures 11, 12:
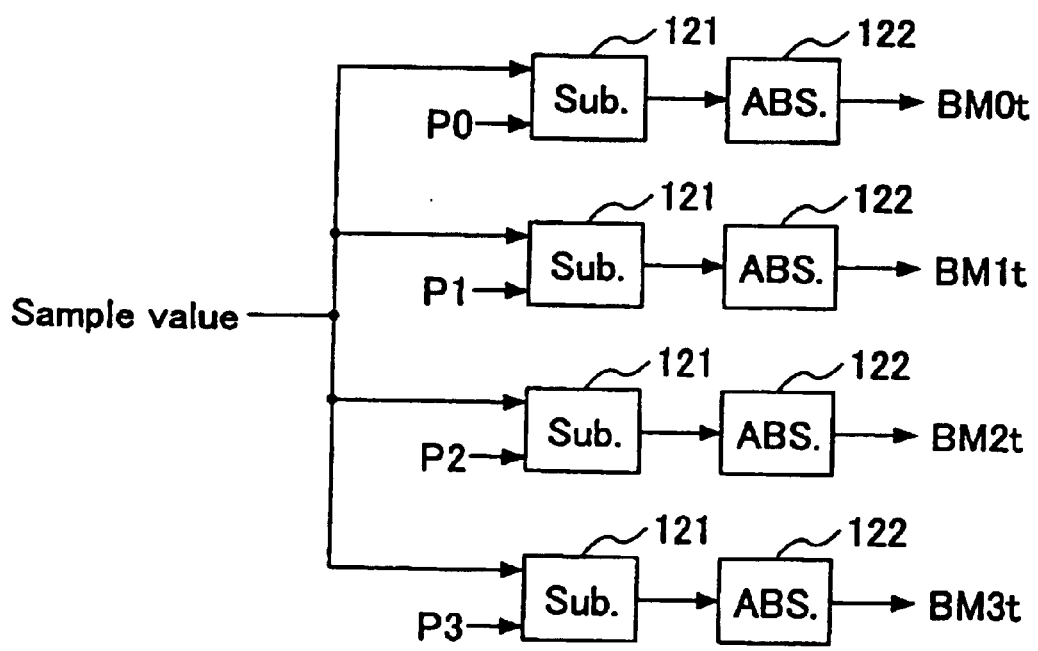
FIG. 11 is a diagram showing a relationship between a data sequence of PR(1,1) and an expected value.
FIG. 12 is a diagram showing a configuration of a branch metric calculator.

FIG. 11 is a diagram showing a relationship between a data sequence of PR(1,1) and an expected value.

In FIG. 11, in a case in which a partial response is PR(1,1), expected values Phs (h=0,1,2,3) a data sequence of a combination of data "0" and data "1" at time t−1 and time t are P0 (=0), P1 (=1), P2 (=1) and P3 (=2). Thus, the expected value is indicated by three levels 0, 1 and 2.

Detailed configuration of the circuits in the first, the second and the third embodiments will now be described.

FIG. 12 is a diagram showing a configuration of the branch metric calculator.

In FIG. 12, the BM calculator 111 includes four Sub-circuit 121 and four ABS circuit 122 for the expected values 0, 1, 2 and 3 to obtain an absolute value of difference between the sample value and the expected value. A branch metric result of the sample value and the expected values P0, P1, P2 and P3 is sent as branch metric outputs BM0t, BM1t, BM2t and BM3t from the four ABS circuit 122 to the ACS*L(u) 112.

The BM calculator may obtain the branch metric result by the square of the difference between the sample value and the expected values.

Figure 13:
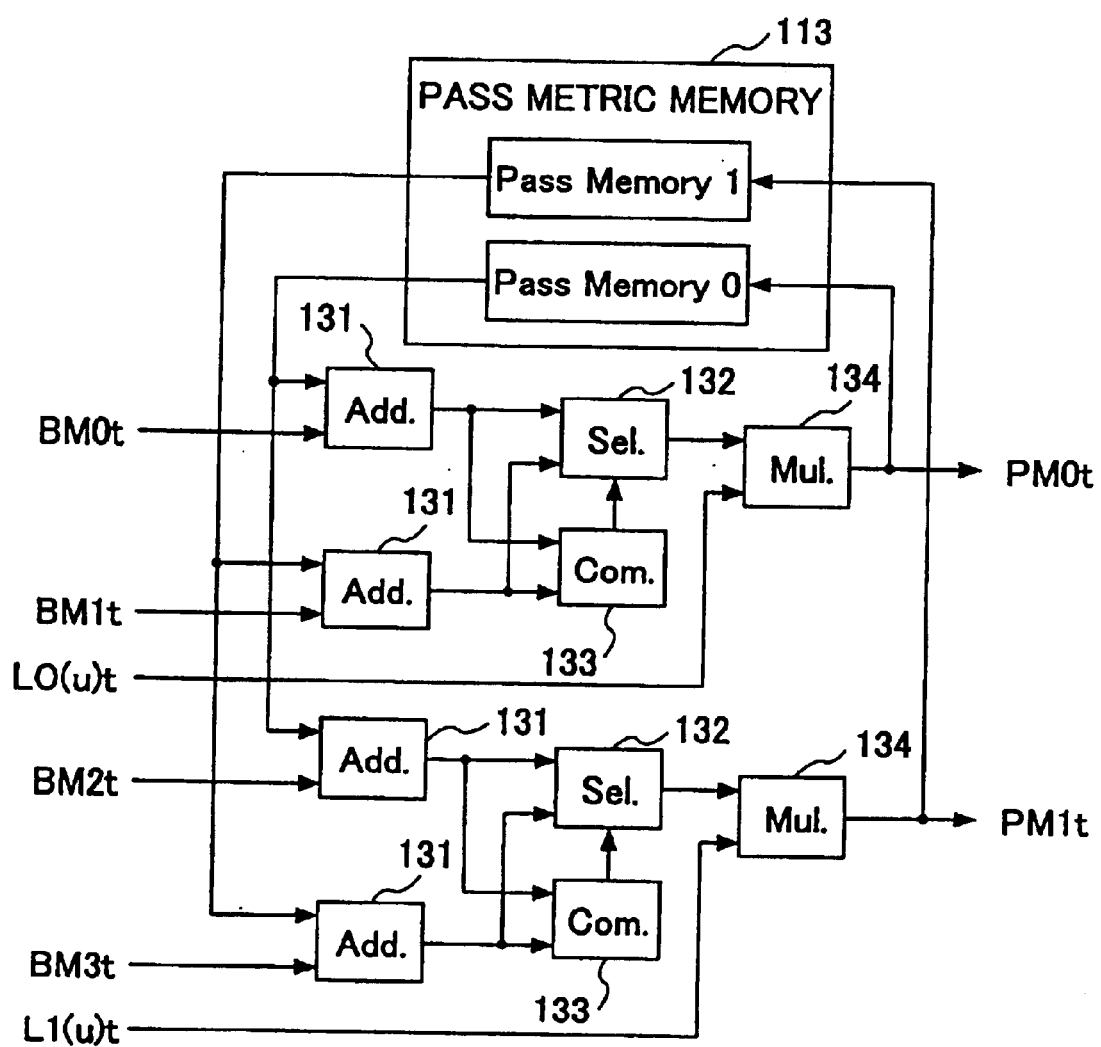
FIG. 13 is a diagram showing a circuit configuration of an ACS*L(u) calculating a pass metric considering a likelihood.

FIG. 13 is a diagram showing a circuit configuration of the ACS*L(u) calculating the pass metric considering the likelihood.

In FIG. 13, the ACS*L(u) 112 obtains a pass metric output PM0t for "0" based on the branch metric outputs BM0t and BM1t from the BM calculator 111 and obtains a pass metric output PM1t for "1" based on the branch metric outputs BM2t and BM3t from the BM calculator 111. A previous pass metric output PM0t is added to the branch metric outputs BM0t and BM1t from the BM calculator 111 at Add-circuits 131 and the branch metric outputs BM0t and BM1t are compared each other at a Com-circuit 133. Based on the comparison result, a Sel-circuit 132 selects either one of the branch metric outputs BM0t and BM1t.

At a Mul-circuit 134, the branch metric outputs BM0t or BM1t which is selected by the Sel-circuit 132 is multiplied by likelihood L0(u)t converted in the pass metric difference/likelihood decoder 116 to obtain the pass metric output PM0t for "0". Then, the pass metric output PM0t for "0" is output and also is stored in a Pass Memory 0 of the pass metric memory 113 at the same time.

To obtain the pass metric output PM1t for "1", the same process is conducted to the branch metric outputs BM2t and BM3t. Then, the pass metric output PM1t for "1", which is obtained by multiplying the branch metric outputs BM2t or BM3t by likelihood L1(u)t, is output and also is stored in a Pass Memory 1 of the pass metric memory 113 at the same time.

When the likelihood L0(u)t or L1(u)t shows "0", probability of a pass indicated by the likelihood L0(u)t or L1(u)t is "0". Initial values for the likelihood L0(u)t and L1(u)t are set to "1" since the branch metric outputs BM0t or BM1t which is selected by the Sel-circuit 132 is output as the pass metric output PM0t and the branch metric outputs BM2t or BM3t which is selected by the Sel-circuit 132 is output as the pass metric output PM1t for an initial branch metric result.

As described above, the pass metric outputs PM0t and PM1t showing probability of data "0" and data "1" to the pass metric difference calculator 114.

FIG. 14 is a diagram showing a circuit configuration of the pass metric difference calculator.

The pass metric difference calculator 114 is used to obtain a difference between the pass metric outputs PM0t and PM1t and then to standardize the difference by a constant K.

In FIG. 14, the pass metric difference calculator 114 includes a Sub-circuit 141 and a Div-circuit 142. In the pass metric difference calculator 114, the Sub-circuit 141 calculates the difference between the pass metric outputs PM0t and PM1t, and the Div-circuit 142 divides the difference obtained by the Sub-circuit 141 by the constant K. A quotient value is output to the pass metric value memory 115.

The content K is a feedback gain of the likelihood. When the content K is set bigger, the influence by the feedback of the likelihood becomes smaller. When the content K is set smaller, the influence by the feedback of the likelihood becomes bigger. The result from subtracting the pass metric output PM1t from the pass metric output PM0t and then dividing by the contact K (=(PM0t−PM1t)/K) is stored in the pass metric difference memory 115. Therefore, it is possible to effectively reduce a storage area of a memory circuit when compared with a case in which both the pass metric outputs PM0t and PM1t are stored in the memory circuit.

FIG. 15 is a diagram showing a relationship between the likelihood and the standardized pass metric difference.

In FIG. 15, likelihood L0' (u) and L1' (u) are ones of updated previous likelihood L0(u) and L1(u).

The constant K is defined as a reference value. A difference, which is obtained by subtracting the difference (PM0t−PM1t) between the pass metric outputs PM0t and PM1t from the constant K), is divided by the constant K. That is, the update likelihood L1' (u) is obtained by this operation ((K−(PM0t−PM1t))/K). And a sum, which is obtained by adding the difference (PM0t−PM1t) between the pass metric outputs PM0t and PM1t to the constant K), is divided by the constant K. That is, the update likelihood L0' (u) is obtained by this operation ((K+(PM0t−PM1t))/K).

FIG. 15 shows expressions obtaining a relationship between the likelihood and the standardized pass metric difference, according to the present invention. In the expressions in FIG. 15, (PM0t−PM1t)/K is a common fraction for the update likelihood L0' (u) and L1' (u). The circuit can be configured so that (PM0t−PM1t)/K is stored as a common fraction. Therefore, it is possible to simplify a circuit for calculating the update circuit L0' (u) and L1' (u).

For example, as shown in FIG. 16, the pass metric difference/likelihood decoder 116 can be configured. FIG. 16 is a diagram showing a circuit configuration of the pass metric difference/likelihood decoder, according to the present invention.

In FIG. 16, (PM0t−PM1t)/K as the common fraction is read from the pass metric difference memory 115. And the common fraction is subtracted from a value "1" at a Sub-circuit 161 and also is added to a value "0" at the Add-circuit 162. Subsequently, the Sub-circuit 161 outputs the update likelihood L1' (u) and the Add-circuit 162 outputs the update likelihood L0' (u). The update likelihood L0' (u) and L1' (u) converted by the pass metric difference/likelihood decoder 116 are output to the ACS*L(u) 112. In the ACS*L(u) 112, the update likelihood L0' (u) and L1' (u) are used as the likelihood Lo(u)t and L1(u)t.

[Fourth Embodiment]

In noises while regenerating data, a certain record order of data creates a certain constant noise pattern. To eliminate such a constant noise pattern, in a variation of the first data format in FIG. 3, for example, a bit order of each of Data 1B, Data 2B, . . . and Data nB is changed.

FIG. 17 is a diagram showing a fifth data format according to a fourth embodiment of the present invention.

In FIG. 17, an original single sequential data is divided into Data 1O, . . . and Data nO at a predetermined data length and each of Data 1O, . . . and Data nO is stored as an original data. And, Data 1I, . . . , Data nI, in which a bit order of each of Data 1O, . . . and Data nO is changed, are stored as an interleave data. A pair of the Data nO and the Data nI is stored as a Data Block n.

For example, a regenerating circuit configuration corresponding to the fifth data format in FIG. 17 is one shown in FIG. 18.

Figure 18A:
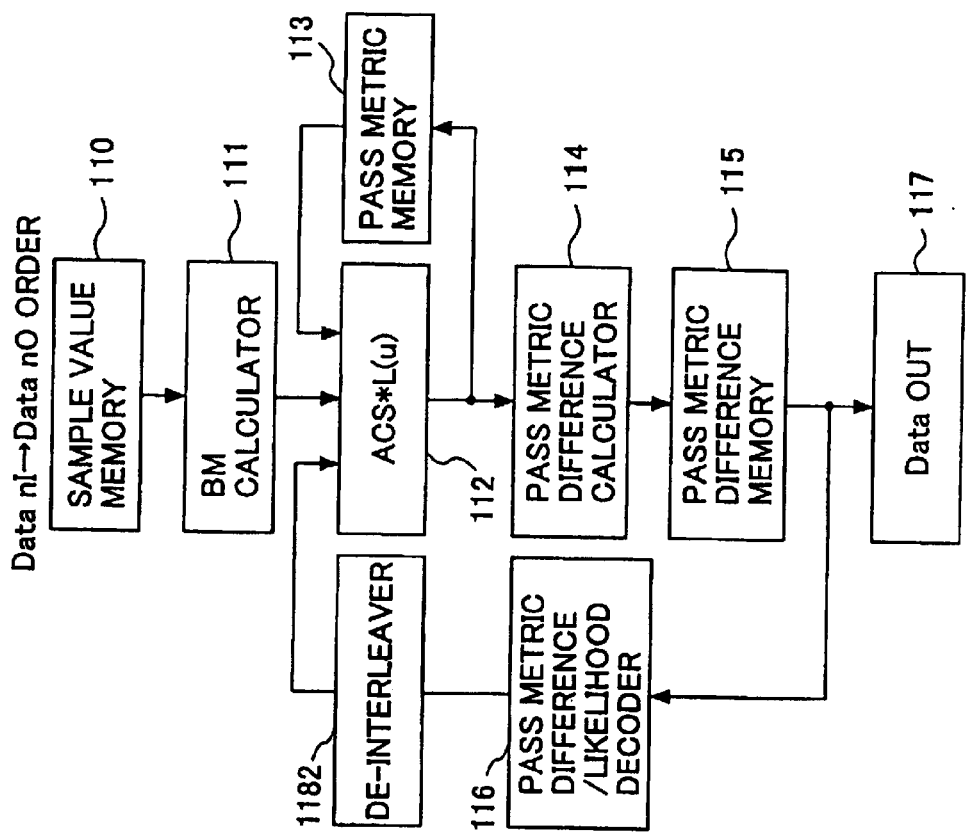
FIG. 18A is a diagram showing the third circuit configuration according to the fourth embodiment of the present invention and FIG. 18B is a diagram showing a variation of the third circuit configuration according to the fourth embodiment of the present invention.

FIG. 18A is a diagram showing the third circuit configuration according to the fourth embodiment of the present invention. In FIG. 18A, circuits that are the same as the ones in FIG. 6 are indicated by the same reference numerals and the explanation thereof will be omitted.

In FIG. 18A, the third circuit configuration is used in a case in which the Data nI is regenerated based on a regeneration result of the Data nO in each Data Block n.

In FIG. 18A, differently from the first circuit configuration, the third circuit configuration additionally includes an interleaver 1181 for changing a bit order to that of the Data nI.

When the sample value of the Data nO is stored in the sample memory 110, the same process conducted in the circuit configuration shown in FIG. 6 is conducted until the pass metric difference/likelihood decoder 116. Subsequently, the interleaver 1181 provided between the pass metric difference/likelihood decoder 116 and the ACS*L(u) 112 converts the bit order of the likelihood converted from the pass metric difference to that of the Data nI. Then, the interleaver 1181 outputs the likelihood in the converted bit order to the ACS*L(u) 112.

After the Data nI is processed, the decoded data is output from the DataOUT 117.

Figure 18B:
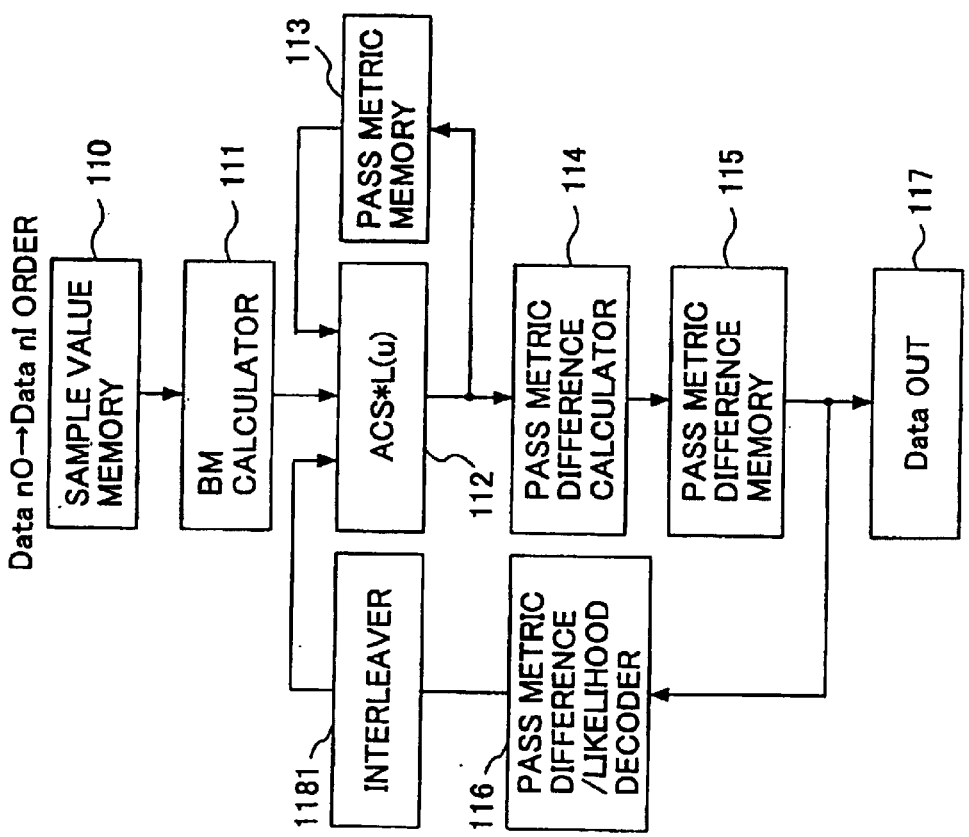

FIG. 18B is a diagram showing a variation of the third circuit configuration according to the fourth embodiment of the present invention. In FIG. 18B, the third circuit configuration is used in a case in which the Data nO is regenerated based on a regeneration result of the Data nI in each Data Block n.

In FIG. 18B, differently from the first circuit configuration, the third circuit configuration additionally includes a de-interleaver 1182 for changing a bit order to that of the Data nO.

When the sample value of the Data nI is stored in the sample memory 110, the same process conducted in the circuit configuration shown in FIG. 6 is conducted until the pass metric difference/likelihood decoder 116. Subsequently, the interleaver 1181 provided between the pass metric difference/likelihood decoder 116 and the ACS*L(u) 112 converts the bit order of the likelihood converted from the pass metric difference to that of the Data nO. Then, the interleaver 1181 outputs the likelihood in the converted bit order to the ACS*L(u) 112.

As described above, the interference of noise is dispersed. Therefore, it is possible to improve accuracy of the likelihood and then upgrade ability of decoding.

The more the bit order is randomized, the more the accuracy of the likelihood can be improved.

FIG. 19 is a diagram showing a circuit configuration of the interleaver according to the fourth embodiment of the present invention.

In FIG. 19, in the interleaver 1181, data is sent sequentially to shift registers SR 201, data is alternately extracted from the shift registers SR 201 to two parallel-to-serial converter 119 and the extracted data is converted in parallel to serial at parallel-to-serial converters 119. Subsequently, a selector 202 selects data so that the bit order becomes a predetermined bit order and then the selector 202 outputs data in the predetermined bit order.

The de-interleaver 1182 has the same circuit configuration as the interleaver shown in FIG. 19. In the de-interleaver 1182, similarly to the interleaver 1181, data is alternately extracted from the shift registers SR 201 shifting data to two parallel-to-serial converters 119, the extracted data is converted in parallel to serial at parallel-to-serial converters 119. Subsequently, a selector 202 selects data so that the bit order becomes an original bit order and then the selector 202 outputs data in the original bit order.

[Fifth Embodiment]

Another data format which can reduce data recording area will now be described.

Figure 20:
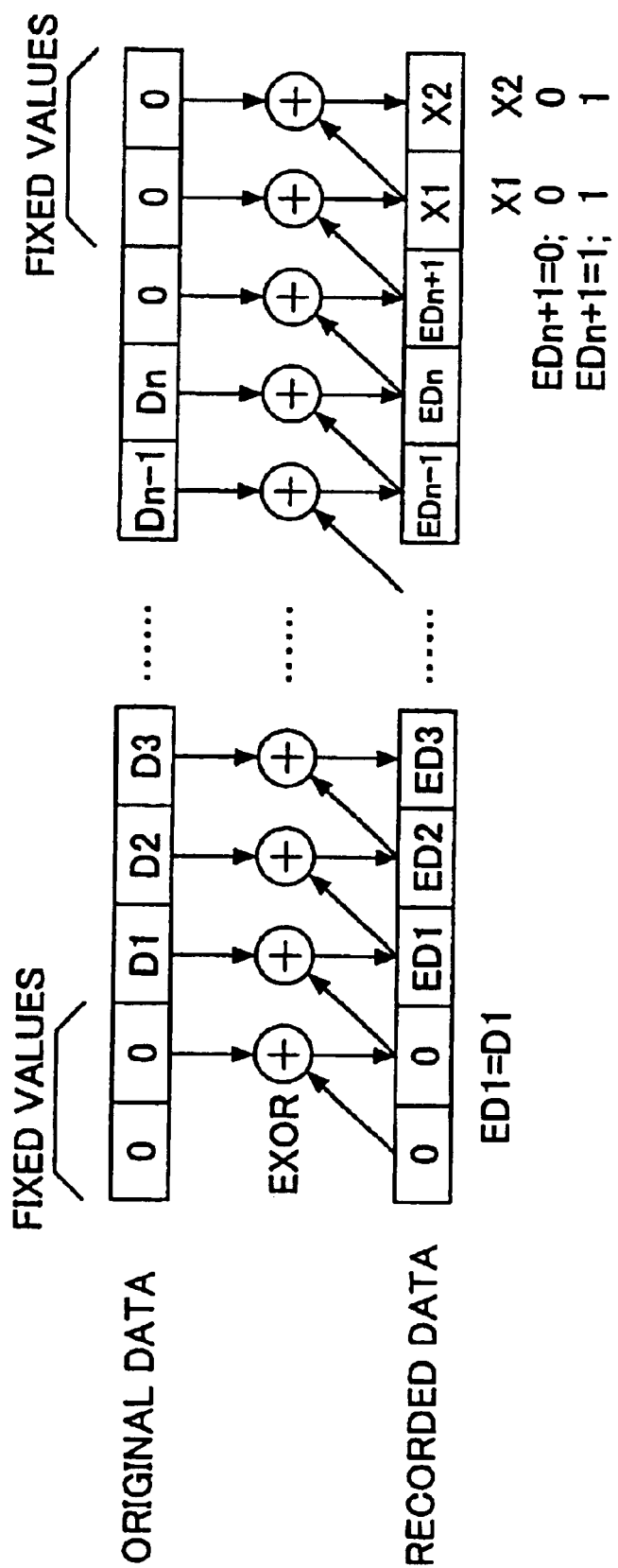
FIG. 20 is a diagram showing a sixth data format according to a fifth embodiment of the present invention.

FIG. 20 is a diagram showing a sixth data format according to a fifth embodiment of the present invention.

In FIG. 20, D1 though Dn denote divided original data and fixed values "0" denote a start or an end delimiter since the fixed values "0" occur a pass merge in which a data sequence or a data block is defined by detecting the most likelihood. D1 though Dn are data units divided at a bit or a predetermined data length. In a case in which data is recorded, when first fixed value for the original data are detected, the predetermined fixed value "0" for occurring a predetermined pass merge are recorded so as to indicated the beginning of the data, and then, an exclusive-or operation is conducted for a next fixed value of the original data and the predetermined fixed value "0" and a result of the exclusive-or operation is stored after the predetermined fixed value "0". Similarly, the exclusive-or operation is conducted for the result "0" and next original data D1 and an exclusive-or ED1 is obtained as a result from exclusive-or operations. The exclusive-or ED1 is recorded and is the same data as the original data D1. The same process is further repeated and then the exclusive-or operation is conducted for the exclusive-or Edn as a previous result and a next original data Dn+1 so as to obtain the exclusive-or Edn+1. Then, the exclusive-or Edn+1 is recorded. The fixed values "0" are additionally provided to the end of the original data in the same method as the beginning of the original data. Data X1 and X2 following to the recorded exclusive-or ED1 through Edn+1 occur the pass merge and then the data X1 and X2 converge to "0" or "1".

The exclusive-or EDn includes Dn−1 and Dn.

Thus, when the recorded data is regenerated, the exclusive-or EDn is read from the beginning and D1 is obtained from the first exclusive-or ED1, D2 is obtained based on the obtained D1 and the exclusive-or ED2, and D3 is obtained based on the obtained D2 and the exclusive-or ED3. In this method, D1 through Dn are obtained in sequence and then the original data can be regenerated.

A plurality of the fixed values "0" is provided for the beginning and the ending of the original data in accordance with the partial response PR.

A probability (likelihood) calculation for data recorded in accordance with the sixth data format in FIG. 20 will now be described.

FIG. 21 is a diagram showing the probability calculation according to the fifth embodiment of the present invention.

In FIG. 21, a method, in which a probability C (hereinafter, called a next EXOR result) of a next exclusive-or (EXOR) operation is obtained based on a next original data A and an EXOR result B obtained by a previous EXOR operation, is shown.

It is assumed that D1 through Dn are bit values. A combination of values of the next original data A and the EXOR result B represents four different ways, that is, (0,0), (0,1), (1,0) and (1,1) where (A,B) is denoted. Then, a next EXOR result C becomes "0", "1", "1" and "0", respectively.

Probability PA(0) denotes a probability that the next original data A is "0" and probability PA(1) denotes a probability that the next original data A is "1". Thus, a sum of probabilities PA(0) and PA(1) becomes "1" (PA(0)+PA(1)=1). Probability PB(0) denotes a probability that the EXOR result B is "0" and probability PB(1) denotes a probability that the EXOR result B is "1". Thus, a sum of probabilities PB(0) and PB(1) becomes "1" (PA(0)+PA(1)=1). Probability PC(0) denotes a probability that the next EXOR result C is "0" and probability PC(1) denotes a probability that the next EXOR result C is "1". Thus, a sum of probabilities PC(0) and PC(1) becomes "1" (PC(0)+PC(1)=1).

Consequently, the probability PC(0), which the next EXOR result C is "0", is shown by a sum of a value resulted from multiplying the probability PA(0) by the probability PB(0) and a value resulted from multiplying the probability PA(1) by the probability PB(1) (shown by an expression (1) in FIG. 21).

Also, the probability PC(0), which the next EXOR result C is "1", is shown by a sum of a value resulted from multiplying the probability PA(0) by the probability PB(1) and a value resulted from multiplying the probability PA(1) by the probability PB(0) (shown by an expression (2) in FIG. 21).

The probability PC(1) that the next EXOR result C is "1" is obtained by a probability form changed from the expression (2), in which a product of the probability PA(1) and the probability PB(1) is multiplied by two and the multiplied product is subtracted from a sum probability resulted from adding the probability PA(1) and the probability PB(1) (PA(1)+PV(1)−2*PA(1)*PB(1)).

Also, by another probability form changed from the expression (1), the probability PC(0) that the next EXOR result C is "0" is one that the probability PC(1) is subtracted from "1"

Figure 22:
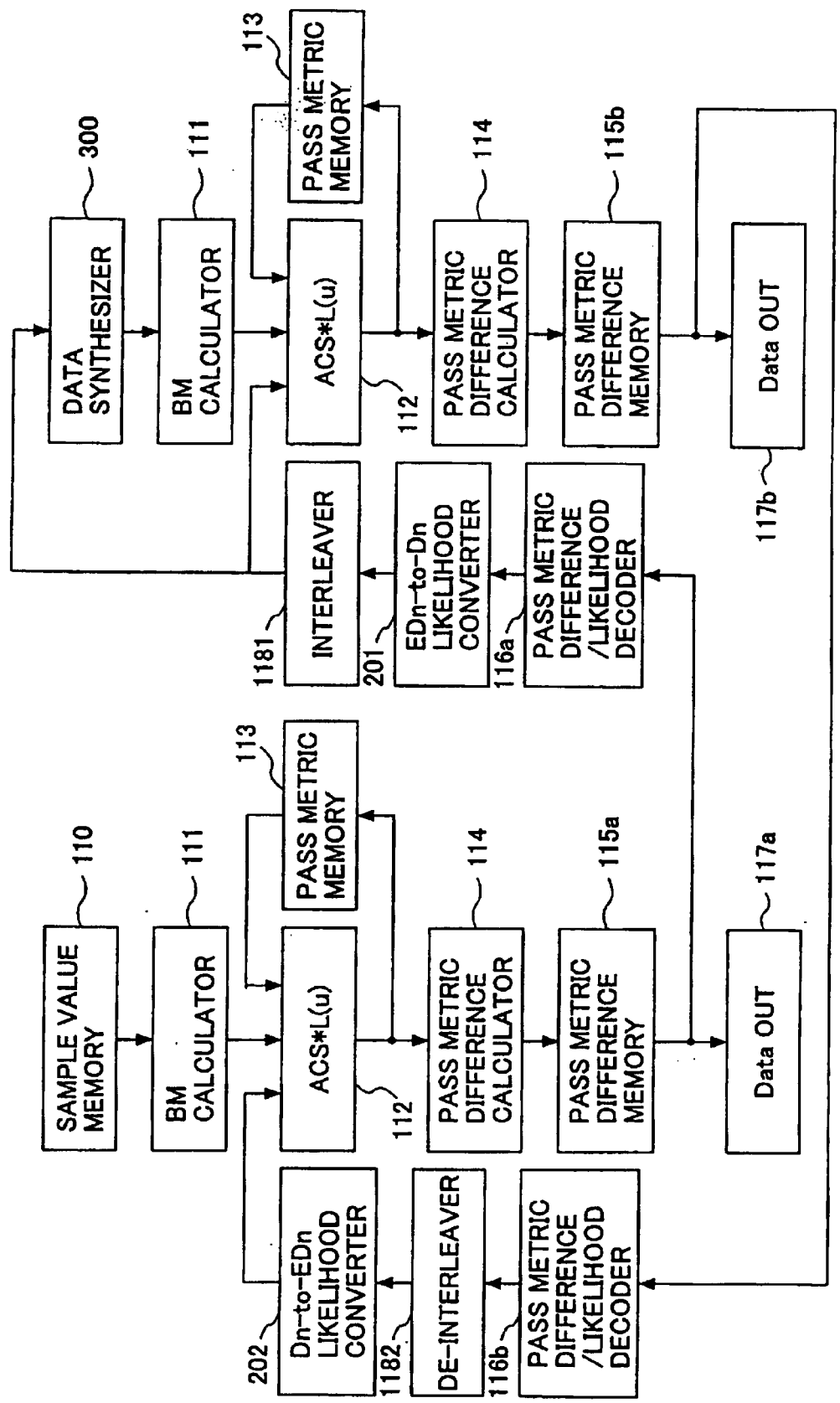
FIG. 22 is a diagram showing a fourth circuit configuration according to the fifth embodiment of the present invention.

FIG. 22 is a diagram showing a fourth circuit configuration according to the fifth embodiment of the present invention. In FIG. 22, circuits that are the same as the ones in FIG. 6, FIG. 8 or FIG. 18 are indicated by the same reference numerals and the explanation thereof will be omitted.

In FIG. 22, differently from the second circuit configuration in FIG. 8, the fourth circuit configuration includes an Edn-to-Dn likelihood converter 201, a Dn-to-Edn likelihood converter 202, an interleaver 1181, a de-interleaver 1182 and a data synthesizer 300.

In FIG. 22, the branch metric is conducted based on an Edn-sample value of EDn stored in the sample value memory 110 at the BM calculator 111 and then the pass metric considering the likelihood of EDn is conducted based on a previous pass metric at the ACS*L(u). A predetermined initial value is given to a first likelihood.

Similarly to the process conducted in FIG. 6, the pass metric difference between pass metric values for "0" and "1" is obtained at the pass metric difference calculator 114 and the pass metric difference is stored in the pass metric difference memory 115a. That is, the pass metric difference of EDn is accumulated at the pass metric difference memory 115a.

In the EDn-to-Dn likelihood converter 201, the EDn-likelihood, which is converted from the pass metric difference stored in the pass metric difference memory 115a, is converted to a Dn-likelihood showing the likelihood of Dn. In the EDn-to-Dn likelihood converter 201, for example, by the following expression:

$$L0(u)Dn = L0(u)EDn - 1 \times L0(u)EDn,$$

the EDn-likelihood is converted to the Dn-likelihood.

Furthermore, the order of the Dn-likelihood obtained by the EDn-to-Dn likelihood converter 201 is interleaved by the interleaver 1181. the interleaved Dn-likelihood is supplied to the data synthesizer 300 and the ACS*L(u) 112.

For example, the data synthesizer 300 synthesizes the interleaved Dn-likelihood with the partial response PR(1,1) that is a characteristic closer to a recording or regenerating characteristic of magneto-optical disk to generate synthesized Dn-data. It is not limited to the partial response PR(1,1) but can be a partial response PR(1,−1) or PR(1,2,1).

Similarly, for the synthesized Dn-data synthesized by the data synthesizer 300, the branch metric and the pass metric are conducted by the BM calculator 111, the ACS*L(u) 112 and the calculated data are accumulated in the pass metric memory 113 and the pass metric difference calculator 114. When the pass metric is calculated, the interleaved Dn-likelihood is considered. That is, the pass metric difference for the synthesized Dn-data is accumulated.

The pass metric difference, which is stored in the pass metric difference memory 115b, is converted into the Dn-likelihood showing likelihood of Dn by the pass metric difference/likelihood decoder 116b.

The de-interleaver 1182 arranges a data order of the Dn-likelihood to that of EDn-likelihood.

The de-interleaved Dn-likelihood is converted into the EDn-likelihood by the Dn-to-EDn likelihood converter 202. For example, the conversion is conducted in accordance with the probability calculation shown in FIG. 21.

The pass metric considering the converted Edn-likelihood is conducted again for the sample value of EDn.

By repeating the above process for a predetermined number of times, it is possible to improve accuracy of the regenerated data. The regenerated data is output from the DataOUT 117a or the DataOUT 117b based on the process.

Alternatively, an interleaved data to be recorded on a recording medium, in which the original data is interleaved and the EXOR operation is conducted, will now be described.

Figure 23:
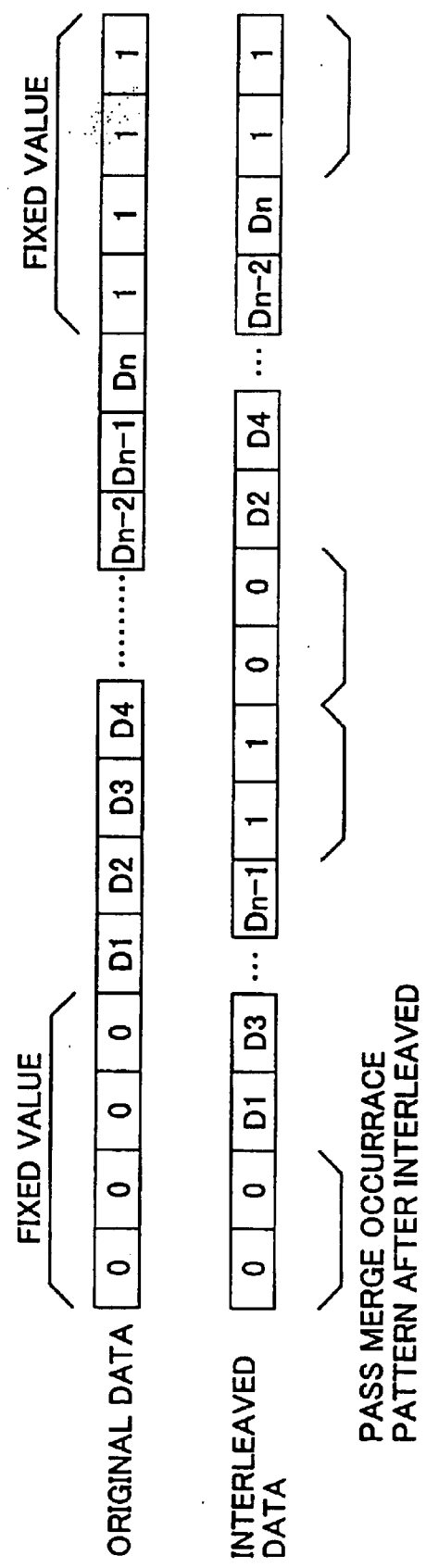
FIG. 23 is a diagram showing interleaved data according to the fifth embodiment of the present invention.

FIG. 23 is a diagram showing an interleaved data according to the fifth embodiment of the present invention.

In FIG. 23, in a case in which the original data D1 through Dn are interleaved to two sequences of data, for example, the partial response PR(1,1) is decoded, a combination to occur the pass merge deciding data is "0" and "0", and, "1" and "1". Thus, when the original data D1 through Dn are interleaved into two sequences of data, the fixed value "0" or "1" is repeated four times. In FIG. 23, the fixed value "0" repeated four times is additionally provided at the beginning of the original data and the fixed value "1" repeated four times is additionally provided at the ending of the original data. This is, the pass merge is used in order to recognize the beginning and the ending of the original data. In the same method, when the original data is interleaved to k sequences of data, the fixed value "0" and "1" are repeated k times and additionally provided at the beginning and the ending of the original data.

When the original data is interleaved to two sequences of data, for example, data at an odd number and data at an even number are extracted from the original data to form two sequences of data. Subsequently, an odd number data sequence is inserted between the fixed value "0" repeated twice for the beginning and the fixed value "1" repeated twice for the ending and also an even number data sequence is inserted between the fixed value "0" repeated twice for the beginning and the fixed value "1" repeated twice for the ending.

As described above, by recording the interleaved original data on the recording medium in accordance with the fifth data format as shown in FIG. 20 after the EXOR operation is conducted, the interleaved original data can be regenerated by the fourth circuit configuration shown in FIG. 22. In the fourth circuit configuration shown in FIG. 22, the de-interleaver may be provided at a step after data is regenerated and before the DataOUT 117, to arrange the data order in accordance with that of the original data.

As describe above, the same data is recorded a plurality of times on the recording medium and the likelihood is updated every time the data is regenerated. Therefore, it is possible to reduce noise derived from the defect of the recording medium and then it is also possible to improve the accuracy of the decoded data.

Also, the data order (the bit order or the data order at a predetermined data length) of the same data can be interleaved and then recorded. And the likelihood is updated every time the data is regenerated. Therefore, it is possible to eliminate noise derived from the data order and then it is also possible to improve the accuracy of the decoded data.

Moreover, the EXOR operation is conducted for the original data and data displacing for one data length (one bit or one predetermined data length) and then the result of the EXOR operation is recorded. Therefore, it is possible to reduce the recording area much more than the method in which the original data is recorded many times.

[Sixth Embodiment]

A fifth circuit configuration, in which data is recorded on the recording medium once and data is decoded while low-frequency noise or high-frequency noise is reduce by two kinds of equalizers, will now be described.

Figure 24:
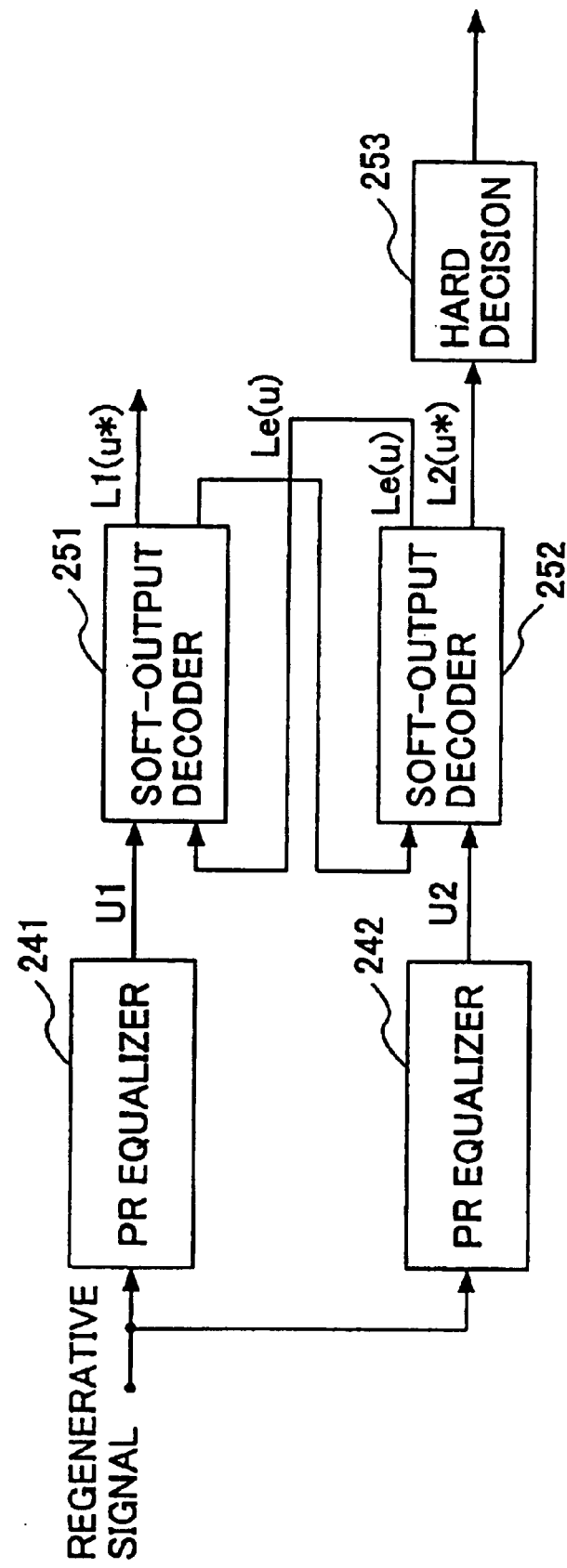
FIG. 24 is a diagram showing the fifth circuit configuration according to the sixth embodiment of the present invention.

FIG. 24 is a diagram showing the fifth circuit configuration according to the sixth embodiment of the present invention.

In FIG. 24, a regenerative signal read from the recording medium is output to a PR equalizer 241 for reducing the high-frequency noise and also a PR equalizer 242 for reducing the low-frequency noise. Equalized regenerative signals U1 and U2 are sampled and sample values of the equalized regenerative signals U1 and U2 are stored in soft output decoders 251 and 252, respectively. The soft output decoders 251 and 252 corresponding to the PR equalizer 241 and 242, respectively, execute the branch metric calculation and the pass metric calculation. Likelihood Le(u) calculated in the soft output decoder 251 is considered when the pass metric is calculated at the soft output decoder 252 and another likelihood L(u) calculated in the soft output decoder 252 is considered when the pass metric is calculated at the soft output decoder 251.

Figure 25:
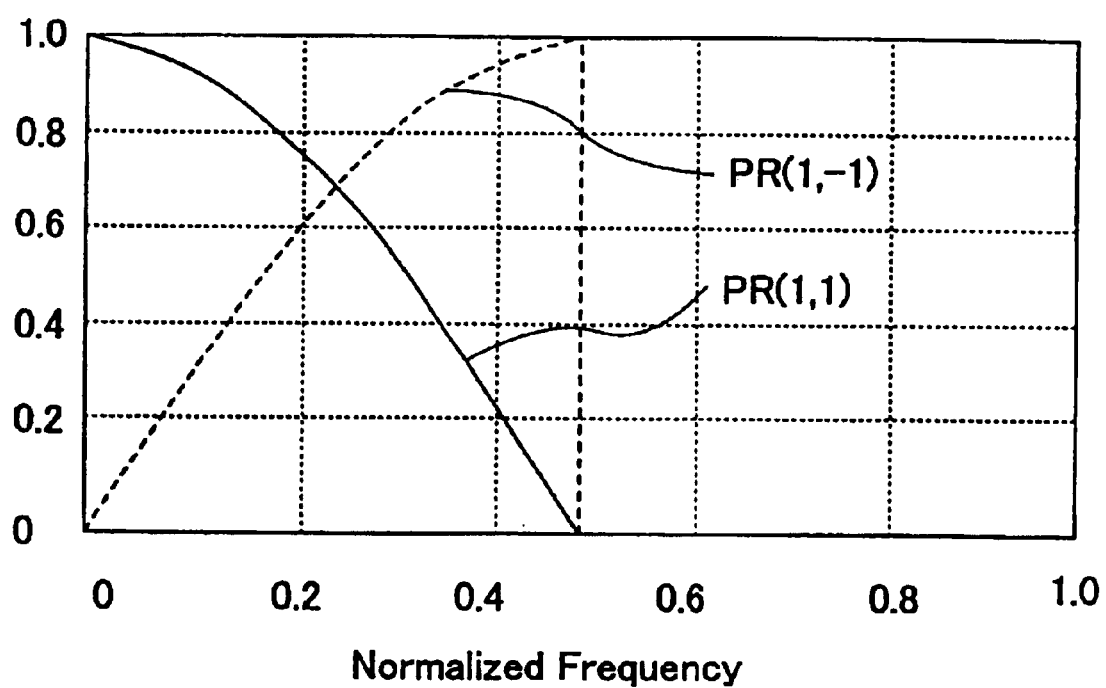
FIG. 25 is a graph showing spectrums of the partial responses PR(1,1) and PR(1,-1)
Figure 26:
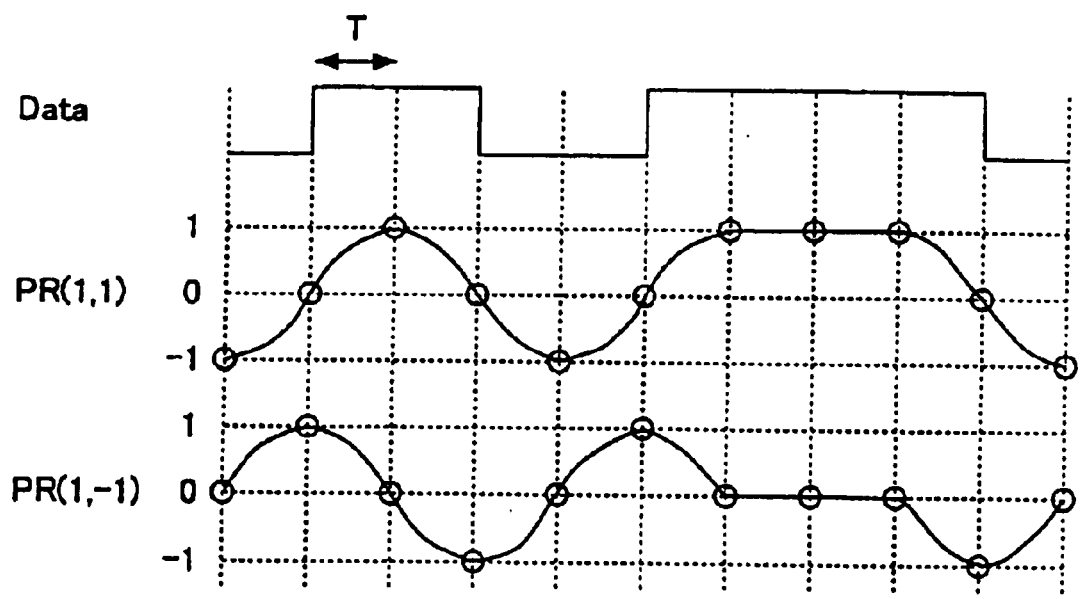
FIG. 26 is a diagram showing partial response equalized waveforms of the partial responses PR(1,1) and PR(1,-1).

For example, the PR equalizer 241 reducing the high-frequency noise equalizes the regenerative signal to the PR (1,1) that effectively reduces the high-frequency noise. For example, the PR equalizer 242 equalizes the regenerative signal to the PR(1,−1) that effectively reduces the low-frequency noise by a differential detection. Spectrums of the partial responses PR(1,1) and PR(1,−1) are shown in FIG. 25. Also, an example of each partial response equalized waveform is shown in FIG. 26.

Each of soft output decoders 251 and 252 is a soft input/soft output (SISO) detector. As a SISO decoder, an APP (A Poteriori Probability) or a SOVA (Soft Output Viterbi Altorithm), which realizes a higher speed but does not achieve the optimum status, is used. The soft output decoders 251 and 252 calculate logarithmic likelihood rate at each bit for each sample data.

The soft output decoders 251 and 252 output results (soft outputs L1(u*) and L2(u*))from a soft decision for a sample value. The soft outputs L1(u*) and L2(u*) are analog data indicating likelihood of "0" and "1" for a bit. Based on these soft outputs, a bit value is presumed by the hard decision 253 and then a digital value showing "0" or "1" is output.

In FIG. 24, one sample value that reduced the high-frequency noise and another sample value that reduced the low-frequency noise is iterated to decode. External information Le(u), which shows a difference between the soft output U1 into the soft output decoder 251 and the soft output L1(u*) from the soft output decoder 251, is a feedback to the soft output decoder 252 as prior information. The external information Le(u) is updated every time the decoding process is conducted. The external information Le(u) is improved by the iterative decoding process by the soft output decoder 251 and the soft output decoder 252. In this case, another external information Le(u), which shows a difference between the soft output U2 input into the soft output decoder 252 and the soft output L2(u*), is a feedback to the soft output decoder 251 as prior information. The iterative decoding process is repeated for a predetermined times or until a predetermined bit error rate is achieved. Based on the soft output L1(u*) or the soft output L2(u*), the hard decision 253 conducts a hard decision process and then outputs regenerated data.

Thus, by the fifth circuit configuration shown in FIG. 24, the branch metric and the pass metric is calculated for the sample data that reduced the high-frequency noise and the sample data that reduced the low-frequency noise of the regenerative signal of the recorded data, by considering mutual external information Le(u). Therefore, it is possible to reduce the data recording area and also it is possible to improve the accuracy of the regenerated data.

In addition, the branch metric and the pass metric is iteratively calculated for the sample data that reduced the high-frequency noise and the sample data that reduced the low-frequency noise of the regenerative signal of the recorded data, by considering mutual external information Le(u). Therefore, it is possible to further improve the accuracy of the regenerated data.

In the embodiments described above, the process by the sample value memory 110 in FIG. 6 corresponds to the sample value storing part in claim, the process by the BM calculator 111 and the ACS*L(u) 112 in FIG. 6 corresponds to the pass metric calculating part in claim, the process by the pass metric difference/likelihood decoder 116 in FIG. 6 corresponds to the likelihood converting part in claim.

As described above, according to the present invention, likelihood is updated and effects the pass metric value every time the same data recorded many times on the recording medium is decoded. Therefore, it is possible to prevent the data regeneration error caused by the defect of the recording medium.

In addition, the same data recorded on the plurality of tracks are decoded in serial. Therefore, it is possible to prevent the data regeneration error caused by the defect of the recording medium and to improve the accuracy of the regenerated data.

Moreover, the data order of the original data is changed and then the original data is recorded. By decoding the original data, it is possible to prevent the data regeneration error caused by the data order and then it is possible to improve the accuracy of the regenerated data.

Furthermore, the original data is converted by the predetermined operation and then is recorded on the recording medium and the decoding processes for the original data and the recorded data are conducted after the original data is generated based on the recorded data recorded on the recording medium. Thus, a required recording area is almost the same as the data length of the original data. Therefore, it is possible to reduce the amount of recording area. In addition, it is possible to decode the recorded data while the recorded data is changed back to the original data. Then, it is possible to prevent the data regeneration error caused by the data order.

Also, the regenerative signal of the recorded data is equalized by different partial response equalizers. Therefore, it is possible to improve the accuracy of the regenerated data.

The present invention is not limited to the specifically disclosed embodiments, variations and modifications, and other variations and modifications may be made without departing from the scope of the present invention.

The present application is based on Japanese Priority Application No. 2000-193370 filed on Jun. 27, 2000, the entire contents of which are hereby incorporated by reference.

What is claimed is:

1. An apparatus for recording and regenerating data, said apparatus comprising:

a recording part converting a first data to be regenerated into a second data in accordance with a predetermined operation and recording the second data;

a first decoding part calculating a branch metric and a pass metric as a first calculation result for a sample data by sampling a regenerative signal from the second data and decoding the second data based on the first calculation result;

a first likelihood converting part converting the first calculation result into a first likelihood of the first calculation result, said first likelihood corresponding to the first data;

a second decoding part generating a synthesized sample value for the first data by a synthesizing process based on the first likelihood, calculating the branch metric and the pass metric as a second calculation result based on the first likelihood, and decoding the second data based on the second calculation result; and a second likelihood converting part converting the second calculation result into a second likelihood of the second calculation result, said second likelihood corresponding to the second data, wherein said first decoding part calculates the pass metric based on the second likelihood converted by said second likelihood converting part, and one of the first data decoded by the second decoding part and the second data decoded by the first decoding part is output as a regenerated data.

2. The apparatus as claimed in claim 1, wherein said recording part coniprises an operation part conducting an exclusive-or operation for the first data at a data unit dividing the first data by a predetermined data, wherein said recording part controls said operation part to conduct the exclusive-or operation for a previous operation result and a next data unit of the first data so as to convert the first data into the second data.

3. The apparatus as claimed in claim 1, wherein said first likelihood converting part comprises:

a converting part converting the first calculation result by said first decoding part into intermediate likelihood of the first calculation result for the second data; and a first likelihood obtaining part obtaining the first likelihood corresponding to the first data based on the intermediate likelihood converted by said converting part and the predetermined operation.

4. The apparatus as claimed in claim 3, wherein said first likelihood converting part comprises an interleaving part changing a data order of the first likelihood to generate an interleaved likelihood wherein the interleaved likelihood generated by said interleaving part is defined as the first likelihood.

5. The apparatus as claimed in claim 1, wherein said second likelihood converting part comprises:

a converting part converting the second calculation result obtained by said second decoding part into intermediate likelihood of the second calculation result for the first data; and a second likelihood obtaining part obtaining the second likelihood corresponding to the first data based on the intermediate likelihood converted by said converting part and the predetermined operation.

6. The apparatus as claimed in claim 5, wherein said second likelihood converting part comprises a dc-interleaving part changing back a data order of the intermediate likelihood to generate a dc-interleaved likelihood wherein the dc-interleaved likelihood generated by said dc-interleaving part is defined as the intermediate likelihood for the first data.

7. The apparatus as claimed in claim 1, wherein said second decoding part synthesizes the first likelihood based on signal characteristics of at least one case of that the data is recorded and that the data is regenerated, and generates a synthesized sample value for the first data.

* * * * *